(12) United States Patent
Chen

(10) Patent No.: US 12,395,127 B2
(45) Date of Patent: Aug. 19, 2025

(54) AUDIO AMPLIFIER WITH FEEDBACK CONTROL

(71) Applicant: Elite Semiconductor Microelectronics Technology Inc., Hsinchu (TW)

(72) Inventor: Isaac Y. Chen, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 529 days.

(21) Appl. No.: 18/071,581

(22) Filed: Nov. 29, 2022

(65) Prior Publication Data

US 2024/0178796 A1 May 30, 2024

(51) Int. Cl.
*H03F 3/217* (2006.01)
*H03F 1/02* (2006.01)

(52) U.S. Cl.
CPC ........... *H03F 1/0205* (2013.01); *H03F 3/217* (2013.01); *H03F 3/2173* (2013.01); *H03F 2200/03* (2013.01)

(58) Field of Classification Search
CPC .. H03F 3/217; H03F 3/2173; H03F 2200/351; H03F 3/2171
USPC .............................................. 330/207 A, 251
See application file for complete search history.

(56) References Cited

U.S. PATENT DOCUMENTS

| | | | |
|---|---|---|---|
| 7,312,654 B2 * | 12/2007 | Roeckner | H03K 17/161 330/10 |
| 10,003,303 B2 * | 6/2018 | Afsahi | H03F 3/213 |
| 2007/0290726 A1 * | 12/2007 | Kaiho | H03F 3/2173 327/108 |
| 2015/0333704 A1 | 11/2015 | Toivonen | |
| 2016/0329870 A1 | 11/2016 | Funahashi | |
| 2017/0279412 A1 | 9/2017 | Afsahi | |

FOREIGN PATENT DOCUMENTS

JP         2001-94350         4/2001

* cited by examiner

*Primary Examiner* — Khanh V Nguyen
(74) *Attorney, Agent, or Firm* — Winston Hsu

(57) ABSTRACT

An audio amplifier includes a plurality of power stages, a driving circuit, and a power stage control circuit. The driving circuit is arranged to drive the power stages. The power stage control circuit includes a feedback circuit and a control circuit. The feedback circuit is coupled to the power stages, and is arranged to generate a feedback signal according to at least one detection input, wherein the at least one detection input includes at least one of a power, a voltage signal corresponding to a switching time of the power stages, and a voltage signal corresponding to a switching frequency of the power stages. The control circuit is coupled between the feedback circuit and the power stages, and is arranged to generate a control signal according to the feedback signal, wherein the control signal is arranged to dynamically control a number of turned-on power stages in the power stages.

19 Claims, 11 Drawing Sheets

AUDIO AMPLIFIER WITH FEEDBACK CONTROL

BACKGROUND OF THE INVENTION

1. Field of the Invention

The present invention is related to an audio amplifier, and more particularly, to an audio amplifier with a power stage control circuit that utilizes a feedback mechanism to dynamically control the number of turned-on power stages.

2. Description of the Prior Art

For a class-D amplifier, there may be a plurality of power stages connected in parallel with each other, wherein the power stages are arranged to receive a driving signal (e.g. a pulse width modulation (PWM) signal) obtained from an input signal (E.G. an audio signal) for driving, and drive a loudspeaker. For a traditional power stage control circuit, for example, a number of turned-on power stages may be determined and controlled according to the input signal. For another example, the number of turned-on power stages may be determined and controlled only according to voltages at output terminals of the power stages. Some problems may occur, however. In a case that the supply voltage supplied to the power stages varies, the traditional power stage control circuit may not be able to dynamically track the supply voltage to optimize the power stages. In addition, there may be a large power loss for the traditional power stage control circuit. As a result, a novel audio amplifier with a power stage control circuit that utilizes a feedback mechanism to dynamically control the number of turned-on power stages is urgently needed, to increase the amplifier efficiency and minimize the power loss.

SUMMARY OF THE INVENTION

It is therefore one of the objectives of the present invention to provide an audio amplifier with a power stage control circuit that utilizes a feedback mechanism to dynamically control the number of turned-on power stages, to address the above-mentioned issues.

According to an embodiment of the present invention, an audio amplifier is provided. The audio amplifier comprises a plurality of power stages, a driving circuit, and a power stage control circuit. The plurality of power stages are coupled in parallel with each other, wherein each of the plurality of power stages comprises a first switch and a second switch, the first switch and the second switch are coupled in series between a first reference voltage and a second reference voltage, and the first reference voltage is higher than the second reference voltage. The driving circuit is coupled to the plurality of power stages, and is arranged to receive an input signal, and generate a driving signal to the plurality of power stages according to the input signal for driving the plurality of power stages. The power stage control circuit comprises a feedback circuit and a control circuit. The feedback circuit is coupled to the plurality of power stages, and is arranged to generate a feedback signal according to at least one detection input, wherein the at least one detection input comprises at least one of a power of the first reference voltage, a voltage signal corresponding to a switching time of the plurality of power stages, and a voltage signal corresponding to a switching frequency of the plurality of power stages. The control circuit is coupled between the feedback circuit and the plurality of power stages, and is arranged to generate a control signal according to the feedback signal, wherein the control signal is arranged to dynamically control a number of turned-on power stages in the plurality of power stages.

According to an embodiment of the present invention, an audio amplifier is provided. The audio amplifier comprises a plurality of power stages, a driving circuit, and a power stage control circuit. The plurality of power stages are coupled in parallel with each other, wherein each of the plurality of power stages comprises a first switch and a second switch, the first switch and the second switch are coupled in series between a first reference voltage and a second reference voltage, and the first reference voltage is higher than the second reference voltage. The driving circuit is coupled to the plurality of power stages, and is arranged to receive an input signal, and generate a driving signal to the plurality of power stages according to the input signal for driving the plurality of power stages. The power stage control circuit comprises a feedback circuit and a control circuit. The feedback circuit is coupled to the plurality of power stages, and is arranged to generate a feedback signal according to at least one detection input, wherein the at least one detection input comprises a voltage signal corresponding to an output current of the plurality of power stages, and the output current is derived from a terminal coupled to the first reference voltage or a terminal coupled to the second reference voltage in each of the plurality of power stages. The control circuit is coupled between the feedback circuit and the plurality of power stages, and is arranged to generate a control signal according to the feedback signal, wherein the control signal is arranged to dynamically control a number of turned-on power stages in the plurality of power stages.

One of the benefits of the present invention is that, by the class-D amplifier of the present invention, under a condition that the supply voltage supplied to the power stages varies, the power stage control circuit in the class-D amplifier of the present invention can be able to dynamically track the supply voltage to optimize the power stages. In addition, the power stage control circuit can generate the control signal under a condition that the power stages have the power loss with the minimum value, for dynamically controlling the number of turned-on power stages in the power stages, which can increase the amplifier efficiency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
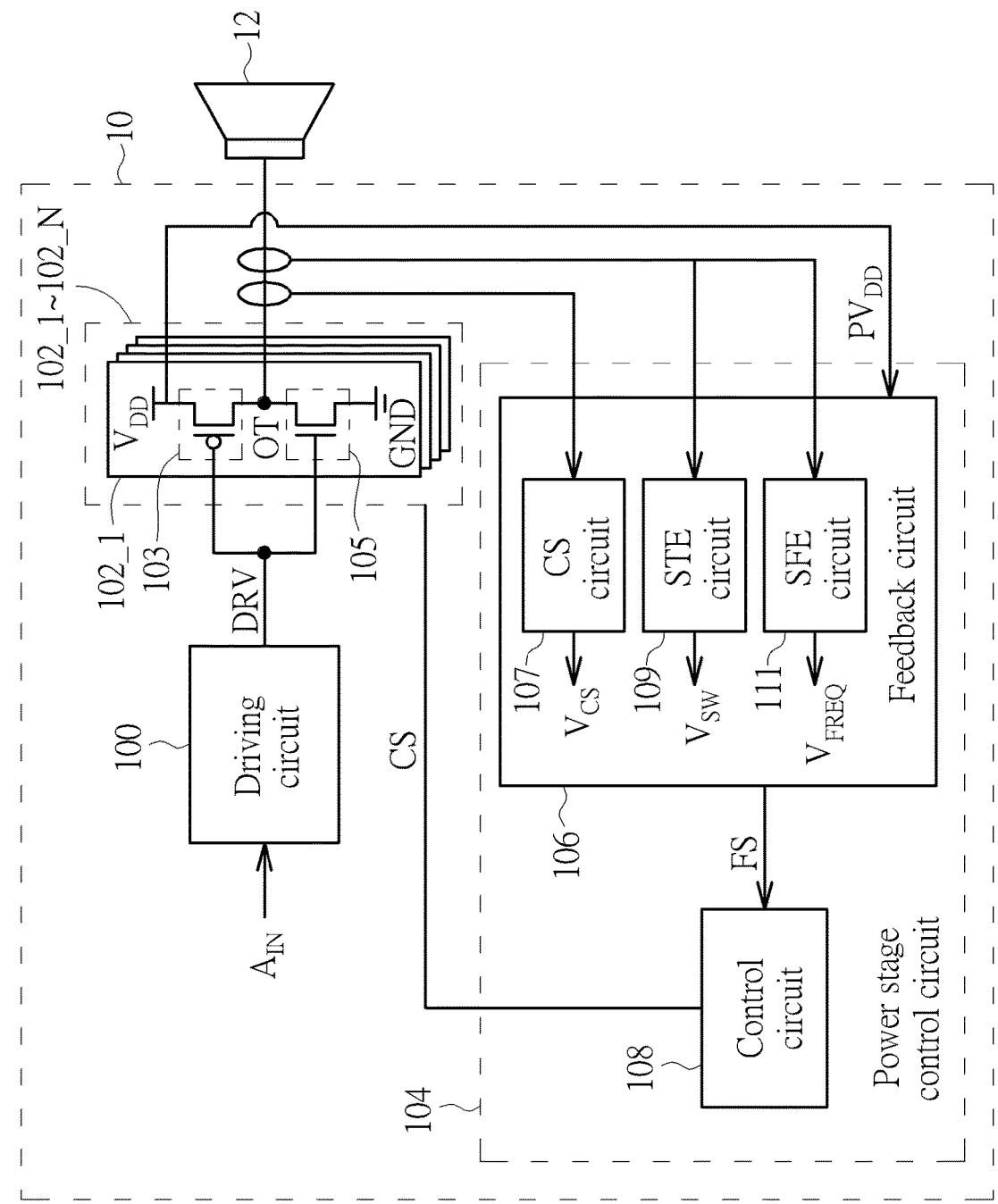
FIG. 1 is a diagram illustrating an audio amplifier according to an embodiment of the present invention.

FIG. 1 is a diagram illustrating an audio amplifier (e.g. a class-D amplifier 10) according to an embodiment of the present invention. As shown in FIG. 1, the class-D amplifier 10 may include a driving circuit 100, a plurality of power stages 102_1-102_N, and a power stage control circuit 104, wherein the power stage control circuit 104 may include a feedback circuit 106 and a control circuit 108. The driving circuit 100 may be coupled to the power stages 102_1-102_N, and may be arranged to receive an input signal (e.g. an audio signal A_IN), and generate and transmit a driving signal DRV to the power stages 102_1-102_N according to the audio signal A_IN for driving the power stages 102_1-102_N. For example, the driving signal DRV may be generated according to a pulse width modulation (PWM) signal corresponding to the audio signal A_IN. The power stages 102_1-102_N may be coupled in parallel with each other, and may be arranged to drive a loudspeaker 12, wherein N is an integer greater than 1 (i.e. N>1), each of the power stages 102_1-102_N may include a P-type transistor and an N-type transistor, and the P-type transistor and the N-type transistor are coupled in series between a supply voltage $V_{DD}$ and a ground voltage GND. Take the power stage 102_1 as an example. The power stage 102_1 may include a P-type transistor 103 and an N-type transistor 105, wherein a source terminal of the P-type transistor 103 is coupled to the supply voltage $V_{DD}$, a drain terminal of the P-type transistor 103 is coupled to a drain terminal of the N-type transistor 105, a source terminal of the N-type transistor 105 is coupled to the ground voltage GND, both of a gate terminal of the P-type transistor 103 and a gate terminal of the N-type transistor 105 are coupled to the driving circuit 100 for receiving the driving signal DRV, and the configuration of P-type transistors and N-type transistors in the power stages 102_2-102_N is the same as that in the power stage 102_1. The present invention is not limited thereto, however. In some embodiments, each of the power stages 102_1-102_N may include two N-type transistors, and the two N-type transistors are coupled in series between the supply voltage $V_{DD}$ and the ground voltage GND.

The feedback circuit 106 may be coupled to the power stages 102_1-102_N, and may include a current sensing circuit (labeled as "CS circuit" in FIG. 1) 107, a switching time extraction circuit (labeled as "STE circuit" in FIG. 1) 109, and a switching frequency extraction circuit (labeled as "SFE circuit" in FIG. 1) 111. The current sensing circuit 107 may be coupled to an output terminal OT between the drain terminal of the P-type transistor and the drain terminal of the N-type transistor in each of the power stages 102_1-102_N, and may be arranged to sense and derive an output current of the power stages 102_1-102_N, and generate a voltage signal $V_{CS}$ corresponding to the output current, where the voltage signal $V_{CS}$ may serve as one detection input. It should be noted that, in some embodiments, the current sensing circuit 107 may be coupled to a high side terminal at the source terminal of the P-type transistor in each of the power stages 102_1-102_N, and may be arranged to sense and derive an output current at the high side terminal, and generate the voltage signal $V_{CS}$ corresponding to the output current, where the voltage signal $V_{CS}$ may serve as one detection input. In some embodiments, the current sensing circuit 107 may be coupled to a low side terminal at the source terminal of the N-type transistor in each of the power stages 102_1-102_N, and may be arranged to sense and derive an output current at the low side terminal, and generate the voltage signal $V_{CS}$ corresponding to the output current, where the voltage signal $V_{CS}$ may serve as one detection input. The switching time extraction circuit 109 may be coupled to the output terminal OT, and may be arranged to derive a switching time of the power stages 102_1-102_N, and generate a voltage signal $V_{SW}$ corresponding to the switching time, where the voltage signal $V_{SW}$ may serve as one detection input. The switching frequency extraction circuit 111 may be coupled to the output terminal OT, and may be arranged to derive a switching frequency of the power stages 102_1-102_N, and generate a voltage signal $V_{FREQ}$ Corresponding to the switching frequency, where the voltage signal $V_{FREQ}$ may serve as one detection input. In addition, the feedback circuit 106 may be further arranged to derive a power $PV_{DD}$ of the supply voltage $V_{DD}$ from the power stages 102_1-102_N, where the power $PV_{DD}$ may serve as one detection input.

It should be noted that at least one detection input may include at least one of the voltage signal $V_{CS}$, the voltage signal $V_{SW}$, the voltage signal $V_{FREQ}$, and the power $PV_{DD}$, and the feedback circuit 106 may be arranged to generate a feedback signal FS according to the at least one detection input. For example, the at least one detection input may only include the power $PV_{DD}$, and each of the voltage signals $V_{CS}$, $V_{SW}$, and $V_{FREQ}$ may be set as a predetermined parameter (e.g. a constant). For another example, the at least one detection input may include the power $PV_{DD}$ and the voltage signal $V_{CS}$, and each of the voltage signals $V_{SW}$ and $V_{FREQ}$ may be set as a predetermined parameter (e.g. a constant). In this embodiment, the at least one detection input includes all of the power $PV_{DD}$ and the voltage signals $V_{CS}$, $V_{SW}$, and $V_{FREQ}$.

Figure 2:
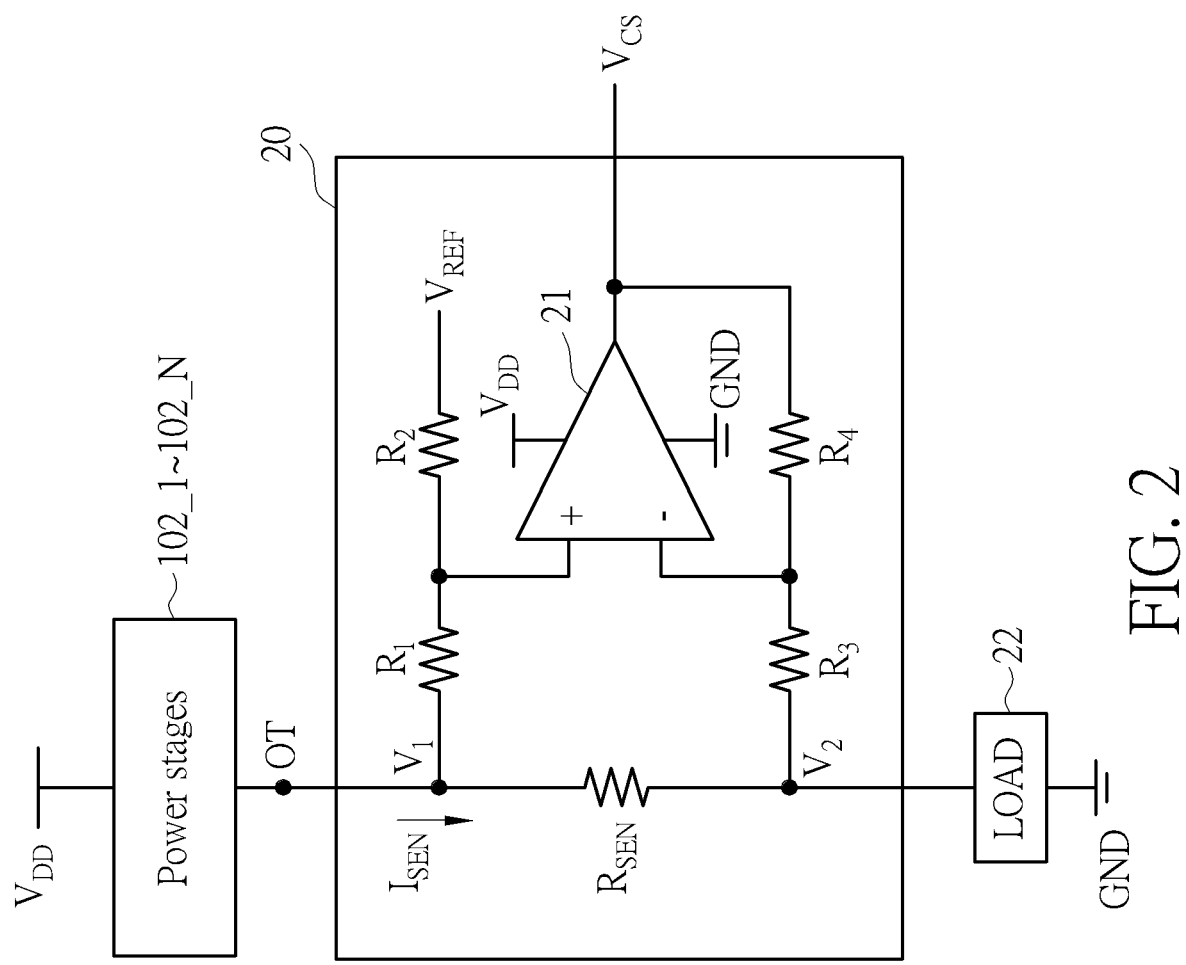
FIG. 2 is a diagram illustrating a current sensing circuit according to an embodiment of the present invention.

FIG. 2 is a diagram illustrating a current sensing circuit 20 according to an embodiment of the present invention, wherein the current sensing circuit 107 shown in FIG. 1 may be implemented by the current sensing circuit 20. As shown in FIG. 2, the current sensing circuit 20 may sense and derive a sensing current $I_{sen}$ from the output terminal OT of the power stages 102_1-102_N, and generate the voltage signal $V_{CS}$ according to the sensing current $I_{sen}$ and a resistor $R_{SEN}$. Specifically, the current sensing circuit 20 may include a plurality of resistors $R_1$, $R_2$, $R_3$, $R_4$, and $R_{SEN}$ and an operational amplifier 21, wherein a resistance value of the resistor $R_1$ is equal to that of the resistor $R_3$, a resistance value of the resistor $R_2$ is equal to that of the resistor $R_4$, a resistance value of the resistor $R_{SEN}$ is much smaller than that of the resistors $R_1$ and $R_2$, and a positive power supply and a negative power supply of the operational amplifier 21 are the supply voltage $V_{DD}$ and the ground voltage GND, respectively. The resistor $R_1$ has a first terminal coupled to the output terminal OT, and a second terminal coupled to a positive terminal (+) of the operational amplifier 21. The resistor $R_2$ has a first terminal coupled to the second terminal of the resistor $R_1$, and a second terminal coupled to a reference voltage $V_{REF}$. The resistor $R_{SEN}$ has a first terminal coupled to the first terminal of the resistor $R_1$, and a second terminal coupled to a load 22 (e.g. the loudspeaker 12 shown in FIG. 1). The resistor $R_3$ has the first terminal coupled to the second terminal of the resistor $R_{SEN}$, and a second terminal coupled to a negative terminal (−) of the operational amplifier 21. The resistor $R_4$ has a first terminal coupled to the second terminal of the resistor $R_3$, and a second terminal coupled to an output terminal of the operational amplifier 21. The voltage signal $V_{CS}$ can be obtained at the output terminal of the operational amplifier 21, and can be expressed by the following equation:

$$V_{CS} = (V_1 - V_2) * \left(\frac{R_2}{R_1}\right) + V_{REF}$$

wherein $V_1$ is a voltage value at the first terminal of resistor $R_{SEN}$, $V_2$ is a voltage value at the second terminal of the resistor $R_{SEN}$, $R_2$ is the resistance value of the resistor $R_2$, $R_1$ is the resistance value of the resistor $R_1$, and $V_{REF}$ is a voltage value of the reference voltage $V_{REF}$.

Figure 3:
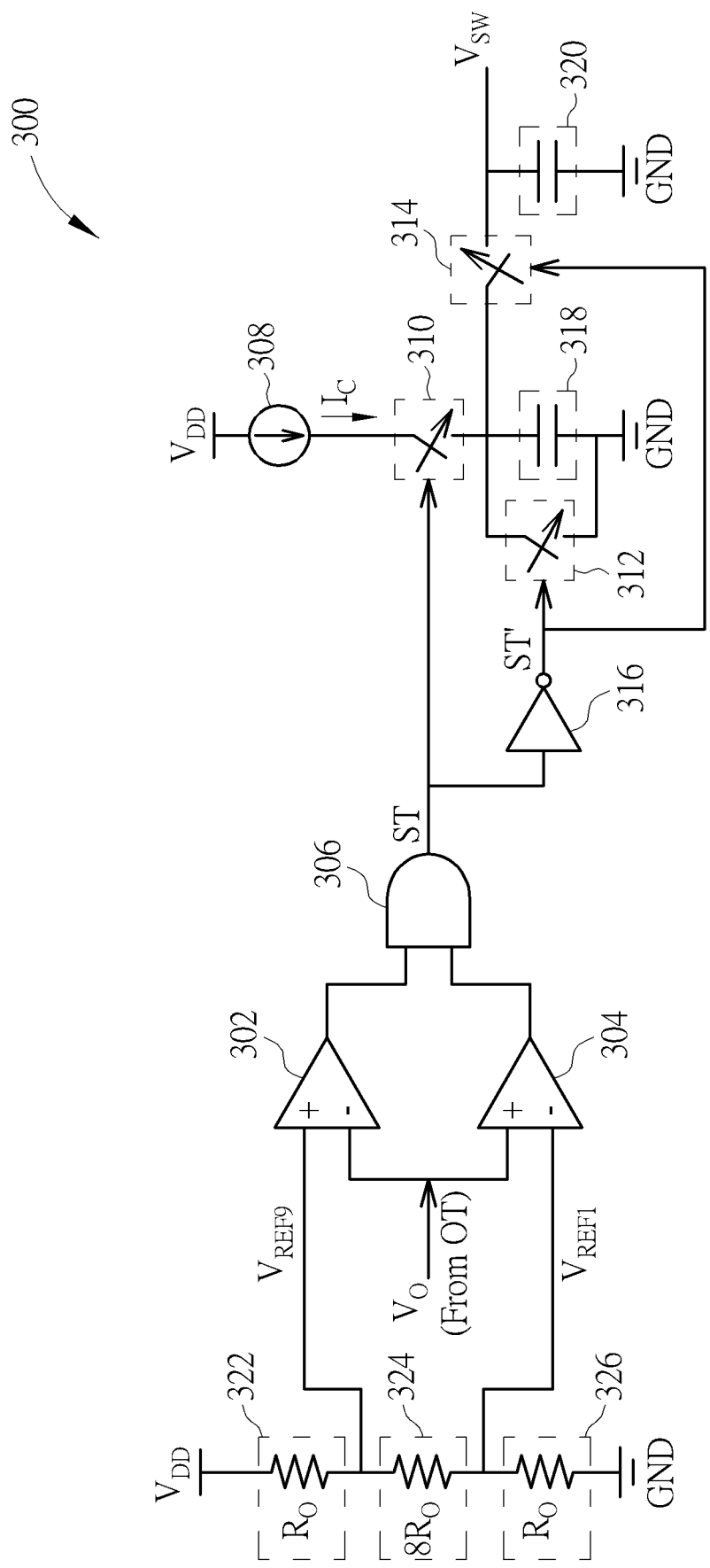
FIG. 3 is a diagram illustrating a switching time extraction circuit according to an embodiment of the present invention.

FIG. 3 is a diagram illustrating a switching time extraction circuit 300 according to an embodiment of the present invention, wherein the switching time extraction circuit 109 shown in FIG. 1 may be implemented by the switching time extraction circuit 300. As shown in FIG. 3, the switching time extraction circuit 300 may include multiple comparators 302 and 304, an AND gate 306, a current source 308, multiple switch circuits 310, 312, and 314, an inverter 316, and multiple capacitors 318 and 320. In this embodiment, the switching time extraction circuit 300 may be arranged to derive a switching time of the power stages 102_1-102_N that is switched between 10%*$V_{DD}$ and 90%*$V_{DD}$, and generate the voltage signal $V_{SW}$ corresponding to the switching time. However, this is for illustration only, and the present invention is not limited thereto. The switching time extraction circuit 300 may further include multiple resistors 322, 324, and 326, wherein the supply voltage $V_{DD}$ is coupled to a first terminal of the resistor 322, a first terminal of the resistor 324 is coupled to a second terminal of the resistor 322, a second terminal of the resistor 324 is coupled to a first terminal of the resistor 326, a second terminal of the resistor 326 is coupled to the ground voltage GND, a resistance value of the resistor 322 is equal to that of the resistor 326, and a resistance value of the resistor 324 is 8 times as large as that of the resistor 322 (e.g. the resistance values of the resistors 322, 324, and 326 are labeled as "$R_o$", "$8R_o$", and "$R_o$", respectively, in FIG. 3).

As shown in FIG. 3, a reference voltage $V_{REF9}$ corresponding to 90%*$V_{DD}$ can be derived at the first terminal of the resistor 324 and can be coupled to a positive terminal (+) of the comparator 302, a reference voltage $V_{REF1}$ corresponding to 10%*$V_{DD}$ can be derived at the second terminal of the resistor 324 and can be coupled to a negative terminal (−) of the comparator 304, and an output voltage $V_o$ at the output terminal OT of the power stages 102_1-102_N is coupled to a negative terminals (−) of the comparator 302 and a positive terminal (+) of the comparator 304. By comparing the reference voltages $V_{REF9}$ and $V_{REF1}$ with the output voltage $V_o$ through the comparators 302 and 304, two comparison results are generated and transmitted to the AND gate 306, wherein a control signal ST is obtained at an output terminal of the AND gate 306, wherein when a level of the control signal ST is high, a voltage value of the output voltage $V_o$ is between 10%*$V_{DD}$ and 90%*$V_{DD}$, and when the level of the control signal ST is low, the voltage value of the output voltage $V_o$ is not between 10%*$V_{DD}$ and 90%*$V_{DD}$. The control signal ST is then transmitted to the switch circuit 310 for controlling turn-on and turn-off of the switch circuit 310. In addition, the control signal ST is further transmitted to an input terminal of the inverter 316, and the inverter 316 may be arranged to invert the control signal ST to generate an inverted control signal ST', and transmit the inverted control signal ST' to the switch circuits 312 and 314 for controlling turn-on and turn-off of the switch circuits 312 and 314. For example, during the high level of the control signal ST, the switch circuit 310 is turned on and the switch circuits 312 and 314 are turned off, and during the low level of the switching time signal ST, the switch circuit 310 is turned off and the switch circuits 312 and 314 are turned on.

The supply voltage $V_{DD}$ is coupled to a first terminal of the current source 308, and a second terminal of the current source 308 is coupled to a first terminal of the switch circuit 310, wherein the current source 308 is arranged to provide a current $I_c$ to the first terminal of the switch circuit 310. When the switch circuit 310 is turned on, a second terminal of the switch circuit 310 is coupled to a first terminal of the capacitor 318, a first terminal of the switch circuit 312, and a first terminal of the switch circuit 314. When the switch circuit 312 is turned on, a second terminal of the switch circuit 312 is coupled to a second terminal of the capacitor 318, wherein the second terminal of the capacitor 318 is coupled to the ground voltage GND. When the switch circuit 314 is turned on, a second terminal of the switch circuit 314 is coupled to a first terminal of the capacitor 320, wherein a second terminal of the capacitor 320 is coupled to the ground voltage GND.

The voltage signal $V_{SW}$ corresponding to the switching time may be obtained at the first terminal of the capacitor 320, and may be expressed by the following equation:

$$C_c * V_{SW} = I_c * ST$$

wherein $C_c$ is a capacitance value of the capacitor 318, $I_c$ is a current value of the current $I_c$ provided by the current source 308, ST is a time during which the level of the control signal ST is high, and the equation can be simplified as:

$$V_{SW} = \frac{ST * I_c}{C_C}$$

Figure 4:
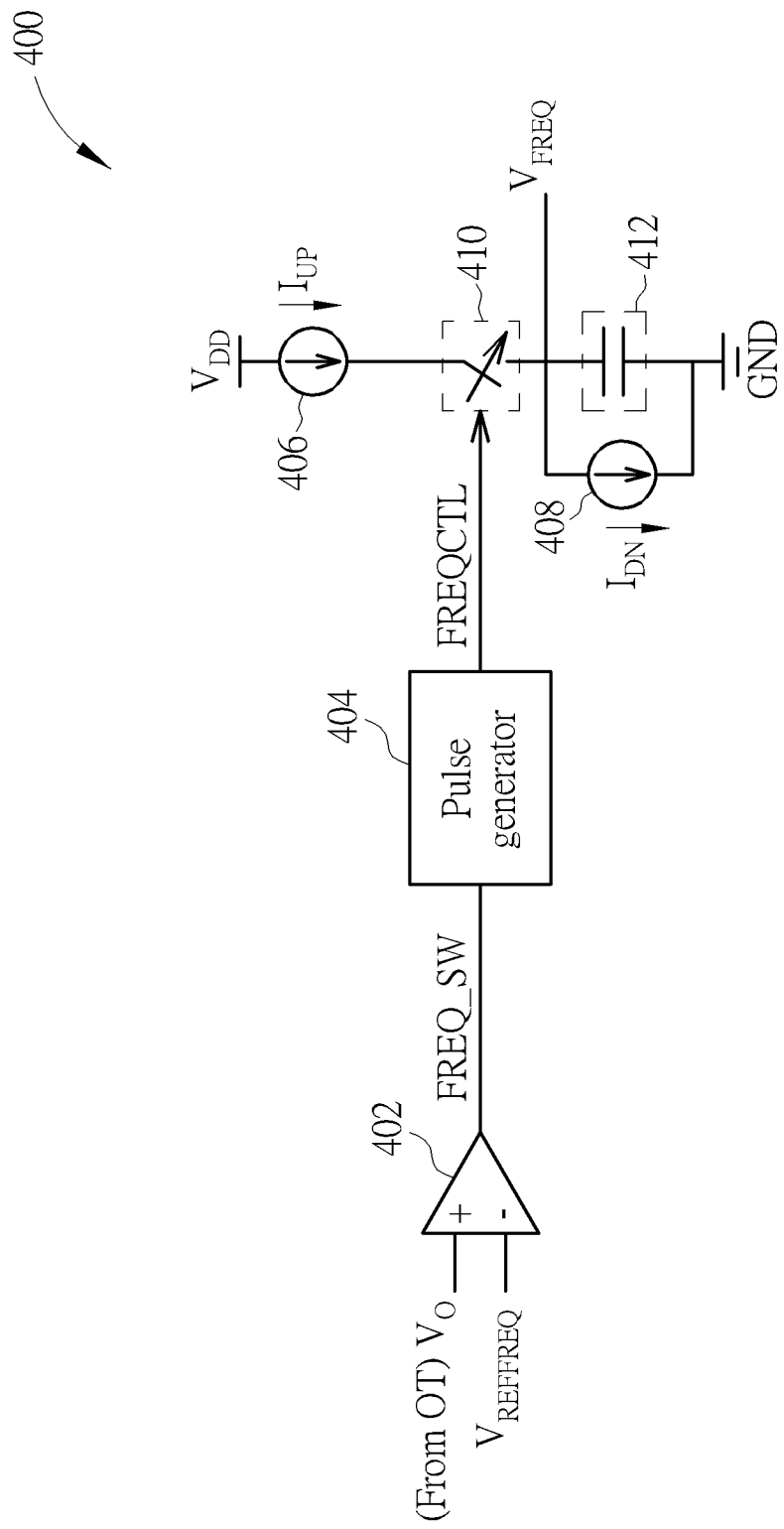
FIG. 4 is a diagram illustrating a switching frequency extraction circuit according to an embodiment of the present invention.
Figure 5:
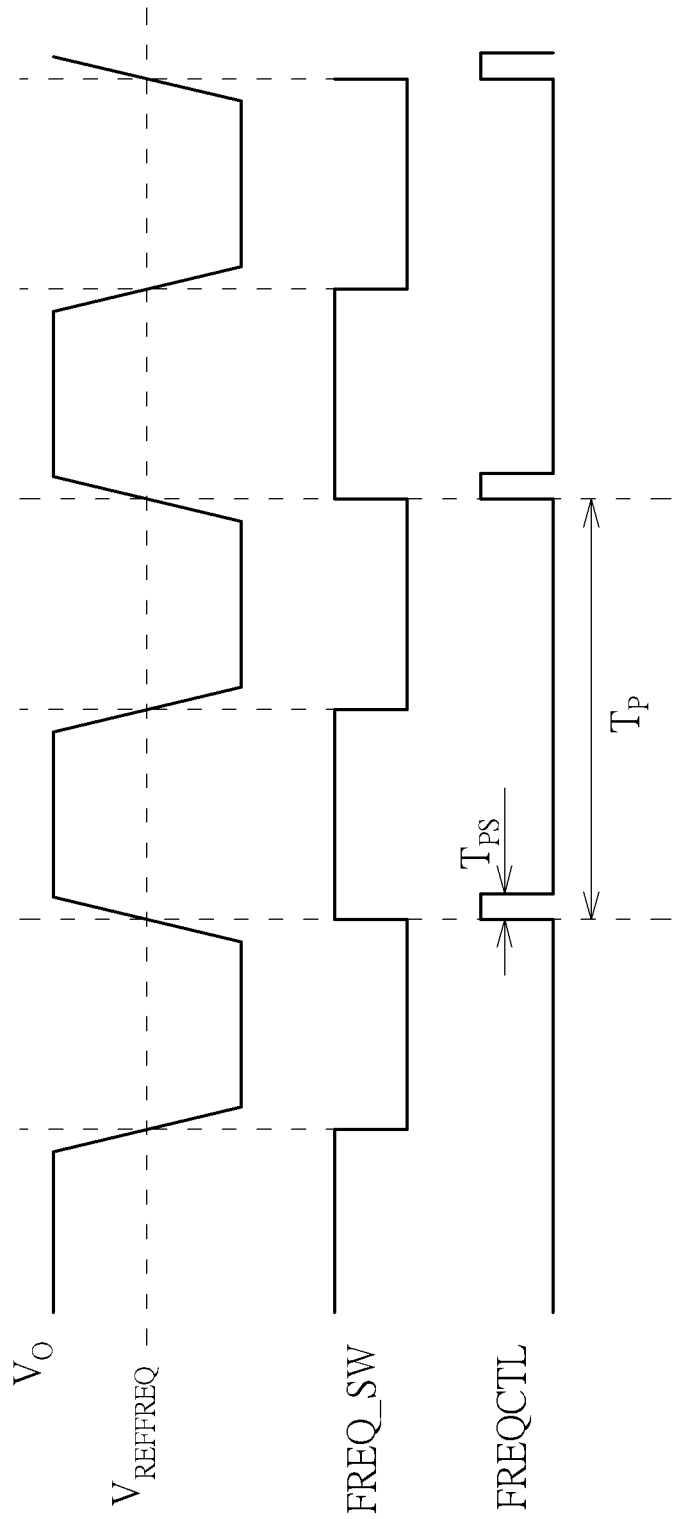
FIG. 5 is a diagram illustrating associated signals of the switching frequency extraction circuit shown in FIG. 4 according to an embodiment of the present invention.

Please refer to FIG. 4 in conjunction with FIG. 5. FIG. 4 is a diagram illustrating a switching frequency extraction circuit 400 according to an embodiment of the present invention, wherein the switching frequency extraction circuit 111 shown in FIG. 1 may be implemented by the switching frequency extraction circuit 400. FIG. 5 is a diagram illustrating associated signals of the switching frequency extraction circuit 400 shown in FIG. 4 according to an embodiment of the present invention. As shown in FIG. 4, the switching frequency extraction circuit 400 may include a comparator 402, a pulse generator 404, multiple current sources 406 and 408, a switch circuit 410, and a capacitor 412. The output voltage $V_o$ at the output terminal OT of the power stages 102_1-102_N is coupled to a positive terminal (+) of the comparator 402, and a reference voltage $V_{REFFREQ}$ is coupled to a negative terminal (−) of the comparator 402. By comparing the output voltage $V_o$ with the reference voltage $V_{REFFREQ}$ through the comparator 402, a square wave FREQ_SW with a higher slew rate is generated at an output terminal of the comparator 402, wherein the switching frequency of the power stages 102_1-

102_N is an inverse of a time period of the square wave FREQ_SW. Afterwards, the square wave FREQ_SW is transmitted to the pulse generator 404, and the pulse generator 404 may be arranged to generate a pulse signal FREQCTL according to the square wave FREQ_SW, wherein when a level of the square wave FREQ_SW is transferred from low to high, a level of the pulse signal FREQCTL is also transferred from low to high and is transferred from high to low after a time interval $T_{PS}$, a time interval $T_P$ between a rising edge of each pulse in the pulse signal FREQCTL is equal to the time period of the square wave FREQ_SW, and the time interval $T_{PS}$ is much smaller than the time interval $T_P$. The pulse signal FREQCTL is then transmitted to the switch circuit 410 for controlling turn-on and turn-off of the switch circuit 410. For example, during the high level of the pulse signal FREQCTL, the switch circuit 410 is turned on, and during the low level of the pulse signal FREQCTL, the switch circuit 410 is turned off.

The supply voltage $V_{DD}$ is coupled to a first terminal of the current source 406, and a second terminal of the current source 406 is coupled to a first terminal of the switch circuit 410, wherein the current source 406 is arranged to provide a current $I_{UP}$ to the first terminal of the switch circuit 410. When the switch circuit 410 is turned on, a second terminal of the switch circuit 410 is coupled to a first terminal of the current source 408 and a first terminal of the capacitor 412, wherein the current source 408 is arranged to provide a current $I_{DN}$, a second terminal of the current source 408 is coupled to a second terminal of the capacitor 412, and the second terminal of the capacitor 412 is coupled to the ground voltage GND.

The voltage signal $V_{FREQ}$ corresponding to the switching frequency may be obtained at the first terminal of the capacitor 412, and may be expressed by the following equation:

$$C_c * V_{FREQ} = T_{PS} * I_{UP} - T_P * I_{DN}$$

wherein $C_c$ is a capacitance value of the capacitor 412, $T_{PS}$ is the time interval $T_{PS}$, $I_{UP}$ is a current value of the current $I_{UP}$ provided by the current source 406, $T_P$ is the time interval $T_P$, and $I_{DN}$ is a current value of the current $I_{DN}$ provided by the current source 408.

Figure 6:
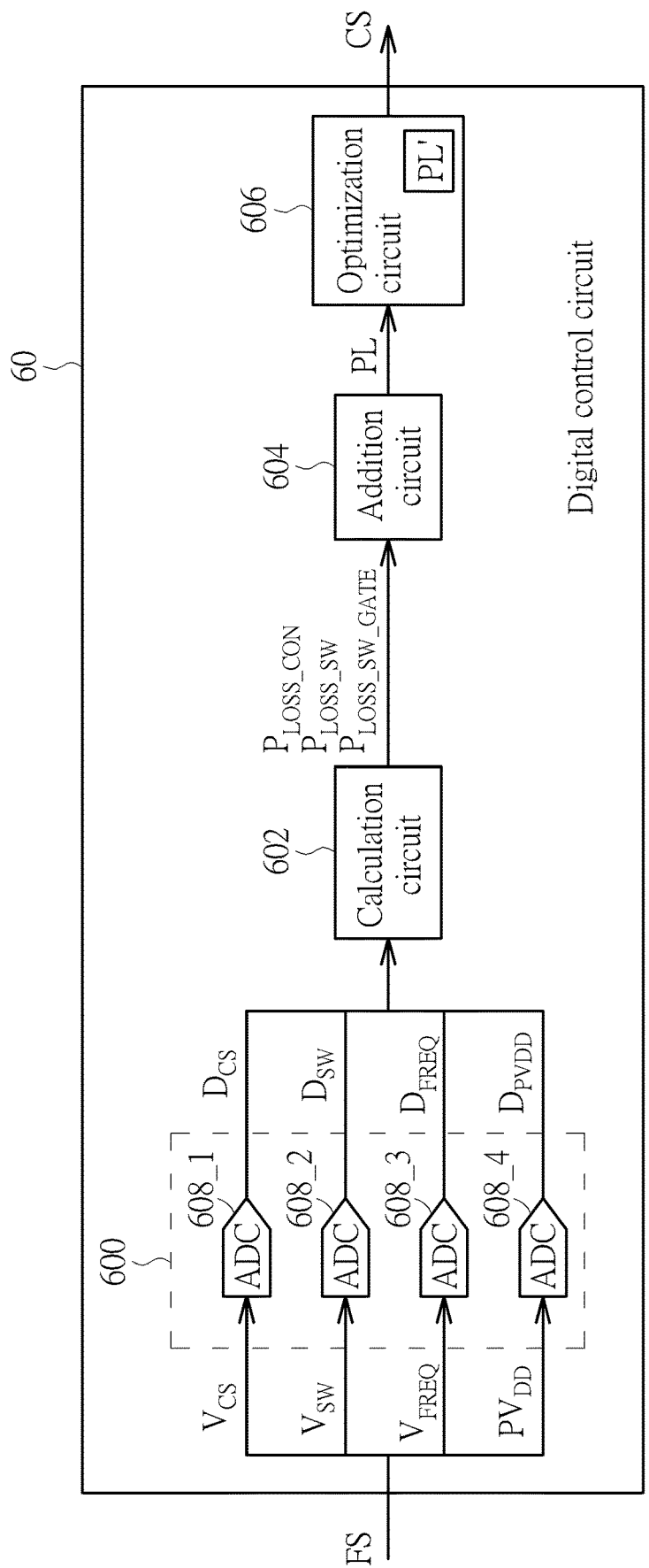
FIG. 6 is a diagram illustrating a digital control circuit according to an embodiment of the present invention.

Please refer back to FIG. 1. The control circuit 108 may be coupled between the feedback circuit 104 and the power stages 102_1-102_N, and may be arranged to generate a control signal CS according to the feedback signal FS, wherein the control signal CS is arranged to dynamically control a number of turned-on power stages in the power stages 102_1-102_N. The control circuit 108 may be implemented by a digital circuit or an analog circuit, depending upon actual design considerations. In detail, please refer to FIG. 6. FIG. 6 is a diagram illustrating a digital control circuit 60 according to an embodiment of the present invention, wherein the control circuit 108 shown in FIG. 1 may be implemented by the digital control circuit 60. As shown in FIG. 6, the digital control circuit 60 may include an input interface circuit 600, a calculation circuit 602, an addition circuit 604, and an optimization circuit 606.

The input interface circuit 600 may include at least one analog to digital converter (ADC), and the at least one ADC may be arranged to convert the feedback signal FS into at least one digital signal. In this embodiment, under a condition that the feedback signal FS is generated according to all of the power $PV_{DD}$ and the voltage signals $V_{CS}$, $V_{SW}$, and $V_{FREQ}$, the input interface circuit 600 may include 4 ADCs 608_1-608_4, wherein the ADC 608_1 may be arranged to convert the voltage signal $V_{CS}$ into a digital signal $D_{CS}$, the ADC 608_2 may be arranged to convert the voltage signal $V_{SW}$ into a digital signal $D_{SW}$, the ADC 608_3 may be arranged to convert the voltage signal $V_{FREQ}$ into a digital signal $D_{FREQ}$, and the ADC 608_4 may be arranged to convert the power $PV_{DD}$ into a digital signal $D_{PVDD}$. In some embodiments, the feedback signal FS may be generated only according to one of the power $PV_{DD}$, the voltage signal $V_{CS}$, the voltage signal $V_{SW}$, and the voltage signal $V_{FREQ}$, and the input interface circuit 600 may only include one ADC for converting said one analog signal into a digital signal. In some embodiments, the feedback signal FS may be generated according to two of the power $PV_{DD}$, the voltage signal $V_{CS}$, the voltage signal $V_{SW}$, and the voltage signal $V_{FREQ}$, and the input interface circuit 600 may include two ADCs for converting said two analog signals into two digital signals, respectively. In some embodiments, the feedback signal FS may be generated according to three of the power $PV_{DD}$, the voltage signal $V_{CS}$, the voltage signal $V_{SW}$, and the voltage signal $V_{FREQ}$, and the input interface circuit 600 may include three ADCs for converting said three analog signals into three digital signals, respectively.

The calculation circuit 602 may be coupled to the input interface circuit 600 (more particularly, the ADCs 608_1-608_4), and may be arranged to calculate a power loss PL of the power stages 102_1-102_N according to the digital signals $D_{CS}$, $D_{SW}$, $D_{FREQ}$, and $D_{PVDD}$. It is assumed that the number of turned-on power stages in the power stages 102_1-102_N is n, wherein n is larger than or equal to 1, and is smaller than or equal to N (i.e. 1≤n≤N). The power loss PL of the power stages 102_1-102_N may include a conduction loss $P_{LOSS\_CON}$, a switching loss $P_{LOSS\_SW}$, and a gate switching loss $P_{LOSS\_SW\_GATE}$ (i.e. PL=$P_{LOSS\_CON}$+$P_{LOSS\_SW}$+$P_{LOSS\_SW\_GATE}$). The conduction loss $P_{LOSS\_CON}$ can be calculated by the following equation:

$$P_{LOSS_{CON}} = \frac{I_{CS}^2 * (R_{UP} + R_{DN})}{n}$$

wherein $I_{CS}$ is a current flowing from the P-type transistor and the N-type transistor to the output terminal OT in each of the plurality of power stages 102_1-102_N, $R_{UP}$ is an on-resistance of the P-type transistor in each of the plurality of power stages 102_1-102_N, $R_{DN}$ is an on-resistance of the N-type transistor in each of the plurality of power stages 102_1-102_N, and n is the number of turned-on power stages in the power stages 102_1-102_N.

The switching loss $P_{LOSS\_SW}$ can be calculated by the following equation:

$$P_{LOSS_{SW}} = 2 * T_{SW} * I_{CS} * \frac{PV_{DD}}{2} * Freq$$

wherein $T_{SW}$ is the switching time of the power stages 102_1-102_N, and is equal to $(Q_{GD}+Q_{GS2})/2*I_G*n$ $$\left(\text{i.e. } T_{SW} = \frac{Q_{GD} + Q_{GS2}}{2 * I_G * n}\right).$$

$Q_{GD}$ is a gate-to-drain charge of the power stages 102_1-102_N, $Q_{GS2}$ is a post-threshold gate-to-source charge of the power stages 102_1-102_N, $I_G$ is a current of the gate terminals of the N-type transistor and the P-type transistor in each of the power stages 102_1-102_N, n is the number of turned-on power stages in the power stages 102_1-102_N, $I_{CS}$ is the current flowing from the P-type transistor and the N-type transistor to the output terminal OT in each of the plurality of power stages 102_1-102_N, and Freq is the switching frequency of the power stages 102_1-102_N.

The gate switching loss $P_{LOSS\_SW\_GATE}$ can be calculated by the following equation:

$$P_{LOSS_{SL_{GATE}}} = n*(C_{GATEUP}+C_{GATEDN})*V_{DD}^2*Freq$$

wherein n is the number of turned-on power stages in the power stages 102_1-102_N, $C_{GATEUP}$ and $C_{GATEDN}$ are a gate capacitance of the P-type transistor and a gate capacitance of the N-type transistor in each of the power stages 102_1-102_N, respectively, and Freq is the switching frequency of the power stages 102_1-102_N.

The addition circuit 604 may be coupled to the calculation circuit 602, and may be arranged to combine the conduction loss $P_{LOSS\_CON}$, the switching loss $P_{LOSS\_SW}$, and the gate switching loss $P_{LOSS\_SW\_GATE}$, to generate an addition result, wherein the addition result can be regarded as the power loss PL of the power stages 102_1-102_N. As a result, a function of the power loss PL can be expressed as follows:

$$PL = \frac{I_{CS}^2*(R_{UP}+R_{DN})}{n}+$$
$$2*T_{SW}*I_{CS}*\frac{PV_{DD}}{2}*Freq+n*(C_{GATEUP}+C_{GATEDN})*$$
$$V_{DD}^2*Freq$$

The optimization circuit 606 may be coupled to the addition circuit 604, and may be arranged to minimize the power loss PL to generate a minimum result. For example, the optimization circuit 606 can differentiate the function of the power loss PL by n to obtain the minimum value, which can be expressed as follows:

$$PL' = \frac{-[I_{CS}^2*(R_{UP}+R_{DN})]}{n^2} -$$
$$\frac{K_{SW}*I_{CS}*PV_{DD}*Freq}{n^2}+(C_{GATEUP}+C_{GATEDN})*V_{DD}^2*Freq$$

wherein $K_{SW}$ is equal to $(Q_{GD}+Q_{GS2})/2*I_G$ $$\left(\text{i.e. } K_{SW} = \frac{Q_{GD}+Q_{GS2}}{2*I_G}\right),$$

$Q_{GD}$ is a gate-to-drain charge of the power stages 102_1-102_N, $Q_{GS2}$ is a post-threshold gate-to-source charge of the power stages 102_1-102_N, and $I_G$ is a current of the gate terminals of the N-type transistor and the P-type transistor in each of the power stages 102_1-102_N; and under a condition that PL'=0 (i.e. the power stages 102_1-102_N has the power loss PL with the minimum value when PL'=0) and $V_{DD}$, Freq, $R_{UP}$, $R_{DN}$, $C_{GATEUP}$, $C_{GATEDN}$, and $K_{SW}$ are constants, n can be expressed by the following equation:

$$n=K*\sqrt{I_{CS}*(a*I_{CS}+b*PV_{DD})}$$

wherein all of K, a, b in the equation are constants.

The optimization circuit 606 may be arranged to generate the control signal CS according to the minimum result (i.e. $n=K*\sqrt{I_{CS}*(a*I_{CS}+b*PV_{DD})}$), to dynamically control the number of turned-on power stages in the power stages 102_1-102_N.

Figure 7:
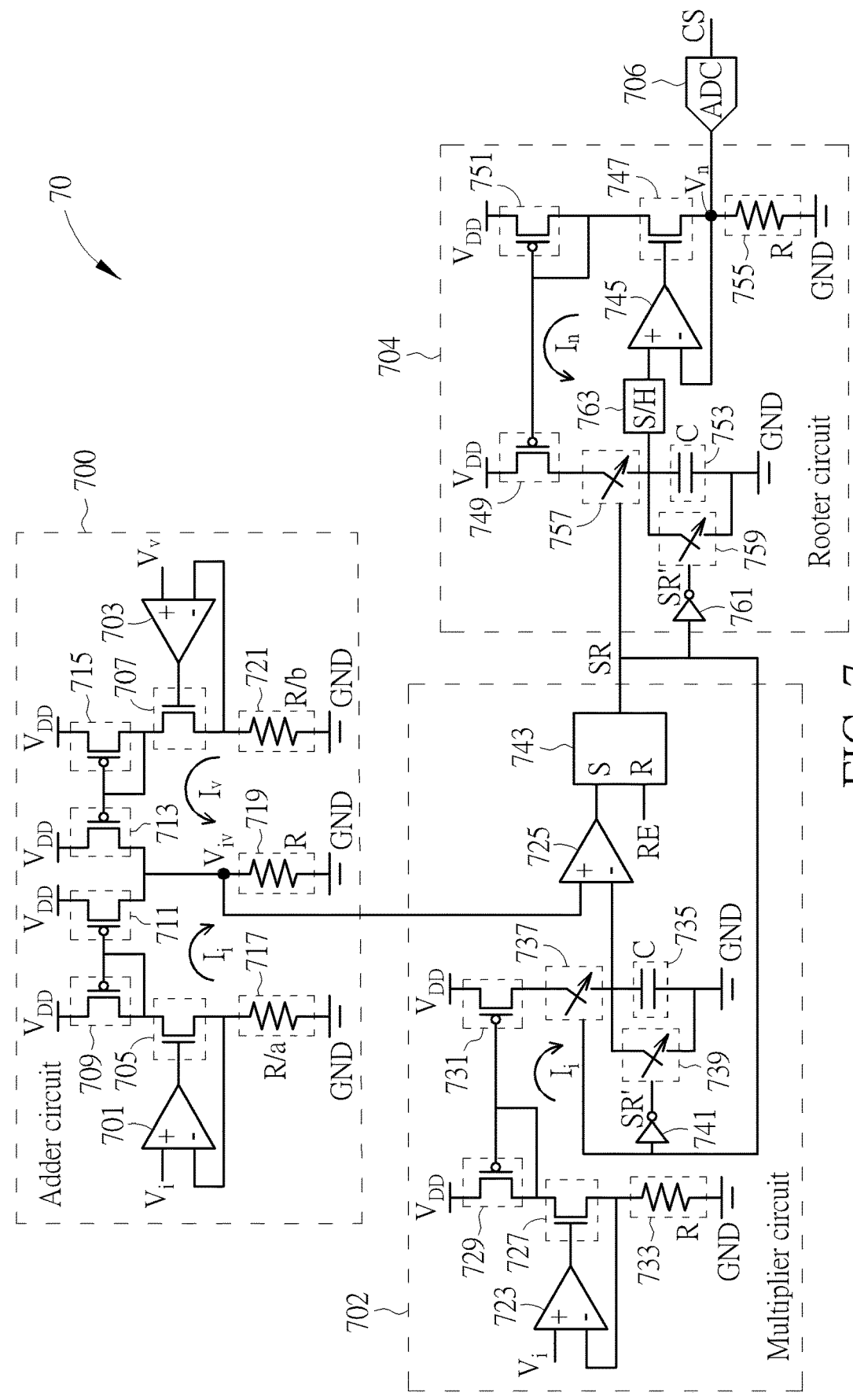
FIG. 7 is a diagram illustrating an analog control circuit according to an embodiment of the present invention.

Please refer to FIG. 7. FIG. 7 is a diagram an analog control circuit 70 according to an embodiment of the present invention, wherein the control circuit 108 shown in FIG. 1 may be implemented by the analog control circuit 70. As shown in FIG. 7, the analog control circuit 70 may include an adder circuit 700, a multiplier circuit 702, a rooter circuit 704, and an output interface circuit (e.g. an ADC 706). The adder circuit 700 may include multiple operational amplifiers 701 and 703, multiple N-type transistors 705 and 707, multiple P-type transistors 709, 711, 713, and 715, and multiple resistors 717, 719, and 721. The operational amplifier 701 has a positive interval (+) coupled to a voltage $V_i$, wherein the voltage $V_i$ corresponds to the current flowing from the P-type transistor and the N-type transistor to the output terminal OT in each of the plurality of power stages 102_1-102_N (i.e. $I_{CS}$). The operational amplifier 703 has a positive interval (+) coupled to a voltage $V_v$, wherein the voltage $V_v$ corresponds to the power $PV_{DD}$ Of the supply voltage $V_{DD}$. The N-type transistor 705 has a gate terminal coupled to an output terminal of the operational amplifier 701 and a source terminal coupled to a negative terminal (−) of the operational amplifier 701. The N-type transistor 707 has a gate terminal coupled to an output terminal of the operational amplifier 703 and a source terminal coupled to a negative terminal (−) of the operational amplifier 703.

The P-type transistor 709 has a source terminal coupled to the supply voltage $V_{DD}$, a drain terminal coupled to a drain terminal of the N-type transistor 705, and a gate terminal coupled to the drain terminal of the N-type transistor 705. The P-type transistor 711 has a source terminal coupled to the supply voltage $V_{DD}$ and a gate terminal coupled to the gate terminal of the P-type transistor 709. The P-type transistor 713 has a source terminal coupled to the supply voltage $V_{DD}$, a drain terminal coupled to a drain terminal of the P-type transistor 711, and a gate terminal coupled to a drain terminal of the N-type transistor 707. The P-type transistor 715 has a source terminal coupled to the supply voltage $V_{DD}$, a gate terminal coupled to the gate terminal of the P-type transistor 713, and a drain terminal coupled to the drain terminal of the N-type transistor 707.

The resistors 717, 719, and 721 have resistance values R/a, R, and R/b, respectively, wherein a and b are the constants included in the above-mentioned equation $n=K*\sqrt{I_{CS}*(a*I_{CS}+b*V_{DD})}$. The resistor 717 has a first terminal coupled to the source terminal of the N-type transistor 705 and a second terminal coupled to the ground voltage GND. The resistor 719 has a first terminal coupled to the drain terminal of the P-type transistor 711 and a second terminal coupled to the ground voltage GND. The resistor 721 has a first terminal coupled to the source terminal of the N-type transistor 707 and a second terminal coupled to the ground voltage GND.

Regarding the operation of the adder circuit 700, a current $$I_i\left(I_i=\frac{V_i}{\frac{R}{a}}\right)$$

may flow from the left side of the adder circuit 700 (i.e. the left side of the P-type transistor 711) to the first terminal of the resistor 719 through the P-type transistor 711, and a current $$I_V\left(I_V = \frac{V_V}{\frac{R}{b}}\right)$$

may flow from the right side of the adder circuit 700 (i.e. the right side of the P-type transistor 713) to the first terminal of the resistor 719 through the P-type transistor 713. In this way, a voltage $V_{iv}$ at the first terminal of the resistor 719 may be expressed by the following equation:

$$V_{iv}=(a*V_i+b*V_v)$$

wherein the voltage $V_{iv}$ may be provided to the multiplier circuit 702.

The multiplier circuit 702 may include multiple operational amplifiers 723 and 725, an N-type transistor 727, multiple P-type transistors 729 and 731, a resistor 733 with a resistance value R, a capacitor 735 with a capacitance value C, multiple switch circuits 737 and 739, an inverter 741, and an SR latch circuit 743. The operational amplifier 723 has a positive terminal (+) coupled to the voltage $V_i$ that corresponds to the current flowing from the P-type transistor and the N-type transistor to the output terminal OT in each of the plurality of power stages 102_1-102_N (i.e. $I_{CS}$). The N-type transistor 727 has a gate terminal coupled to an output terminal of the operational amplifier 723 and a source terminal coupled to a negative terminal (−) of the operational amplifier 723. The resistor 733 has a first terminal coupled to the source terminal of the N-type transistor 727 and a second terminal coupled to the ground voltage GND. The operational amplifier 725 has a positive terminal (+) coupled to the first terminal of the resistor 719 in the adder circuit 700, for receiving the voltage $V_{iv}$.

The P-type transistor 729 has a source terminal coupled to the supply voltage $V_{DD}$, a drain terminal coupled to a drain terminal of the N-type transistor 727, and a gate terminal coupled to the drain terminal of the N-type transistor 727. The P-type transistor 731 has a source terminal coupled to the supply voltage $V_{DD}$ and a gate terminal coupled to the gate terminal of the P-type transistor 729. The capacitor 735 has a first terminal coupled to a negative terminal of the operational amplifier 725 and a second terminal coupled to the ground voltage GND. The switch circuit 737 has a first terminal coupled to a drain terminal of the P-type transistor 731, wherein when the switch circuit 737 is turned on, a second terminal of the switch circuit 737 is coupled to the first terminal of the capacitor 735. The switch circuit 739 has a first terminal coupled to the first terminal of the capacitor 735, wherein when the switch circuit 739 is turned on, a second terminal of the switch circuit 739 is coupled to the second terminal of the capacitor 735. The SR latch circuit 743 has an input terminal S, a reset terminal R, and an output terminal, wherein the input terminal S is coupled to an output terminal of the operational amplifier 725, the reset terminal R is arranged to receive a reset signal RE for resetting the SR latch circuit 743, and the output terminal is coupled to the switch circuit 737 and is arranged to transmit a control signal SR for controlling turn-on and turn-off of the switch circuit 737. In addition, the output terminal of the SR latch circuit 743 is further coupled to an input interval of the inverter 741, and is further arranged to transmit the control signal SR to the input interval of the inverter 741, wherein the inverter 741 may be arranged to invert the control signal SR to generate an inverted control signal SR', and transmit the inverted control signal SR' to the switch circuit 739 for controlling turn-on and turn-off of the switch circuit 739. For example, during a high level of the control signal SR, the switch circuit 737 is turned on and the switch circuit 739 is turned off, and during a low level of the control signal SR, the switch circuit 737 is turned off and the switch circuit 739 is turned on.

In addition, a current $$I_i\left(=\frac{V_i}{R}\right)$$

may flow from the left side of the multiplier circuit (i.e. the left side of the P-type transistor 731) to the first terminal of the switch circuit 737 through the P-type transistor 731. In this way, a time $T_{iiv}$ that represents a turned-on time of the switch circuit 737 (i.e. during the time $T_{iiv}$, the level of the control signal SR is high) may be expressed by the following equation:

$$C*V_{iv} = \left(\frac{R}{V_i}\right)*T_{iiv}$$

wherein the equation can be simplified as:

$$T_{iiv} = \left(\frac{C}{R}\right)*(V_i*V_{iv})$$

The rooter circuit 704 may include an operational amplifier 745, an N-type transistor 747, multiple P-type transistors 749 and 751, a capacitor 753 with a capacitance value C, a resistor 755 with a resistance value R, multiple switch circuits 757 and 759, an inverter 761, and a sample and hold circuit (for brevity, labeled as "S/H" in FIG. 7) 763. The operational amplifier 745 has a positive terminal (+) coupled to the sample and hold circuit 763, a negative terminal (−) coupled to a first terminal of the resistor 755, and an output terminal coupled to a gate terminal of the N-type transistor 747. The N-type transistor 747 has a source terminal coupled to the first terminal of the resistor 755. The resistor 755 has a second terminal coupled to the ground voltage GND. The P-type transistor 749 has a source terminal coupled to the supply voltage $V_{DD}$. The P-type transistor 751 has a source terminal coupled to the supply voltage $V_{DD}$, a gate terminal coupled to a gate terminal of the P-type transistor 749, and a drain terminal coupled to the gate terminal of the P-type transistor 749 and a drain terminal of the N-type transistor 747.

The SR latch circuit 743 may be further arranged to transmit the control signal SR to the rooter circuit 704 (more particularly, the switch circuit 757 and an input terminal of the inverter 761), wherein the control signal SR may be arranged to control turn-on and turn-off of the switch circuit 757, and the inverter 761 may be arranged to invert the control signal SR to generate the inverted control signal SR', and transmit the inverted control signal SR' to the switch circuit 759 for controlling turn-on and turn-off of the switch circuit 759. For example, during the high level of the control signal SR, the switch circuit 757 is turned on and the switch circuit 759 is turned off, and during the low level of the control signal SR, the switch circuit 757 is turned off and the switch circuit 759 is turned on. The switch circuit 757 has a first terminal coupled to a drain terminal of the P-type transistor 749, wherein when the switch circuit 757 is turned on, a second terminal of the switch circuit 757 is coupled to the sample and hold circuit 763 and a first terminal of the capacitor 753, wherein a second terminal of the capacitor 753 is coupled to the ground voltage GND. The switch circuit 759 has a first terminal coupled to the sample and hold circuit 763 and the first terminal of the capacitor 753, wherein when the switch circuit 759 is turned on, a second terminal of the switch circuit 759 is coupled to the second terminal of the capacitor 753.

In addition, a current $$I_n \left( = \frac{V_n}{R} \right)$$

may flow from the right side of the multiplier circuit (i.e. the right side of the P-type transistor 749) to the first terminal of the switch circuit 757 through the P-type transistor 749, wherein $V_n$ is a voltage value at the first terminal of the resistor 755, and corresponds to the number of turned-on power stages in the power stages 102_1-102_N. In this way, $V_n$ can be expressed by the following equation:

$$C * V_n = \frac{R}{V_n} * T_{iiv}$$

wherein $T_{iiv}$ represents a turned-on time of the switch circuit 757, and since $$T_{iiv} = \left( \frac{C}{R} \right) * (V_i * V_{iv})$$

(which is obtained by the multiplier circuit 702) and $V_{iv} = (a*V_i + b*V_v)$ (which is obtained by the adder circuit 700), the equation can be simplified as:

$$V_n = \sqrt{V_i * (a*V_i + b*V_v)}$$

The ADC 706 may be coupled to the rooter circuit 704 (more particularly, the first terminal of the resistor 755), and may be arranged to convert $V_n$ into the control signal CS, wherein the control signal CS is arranged to dynamically control a number of turned-on power stages in the power stages 102_1-102_N.

Figure 8:
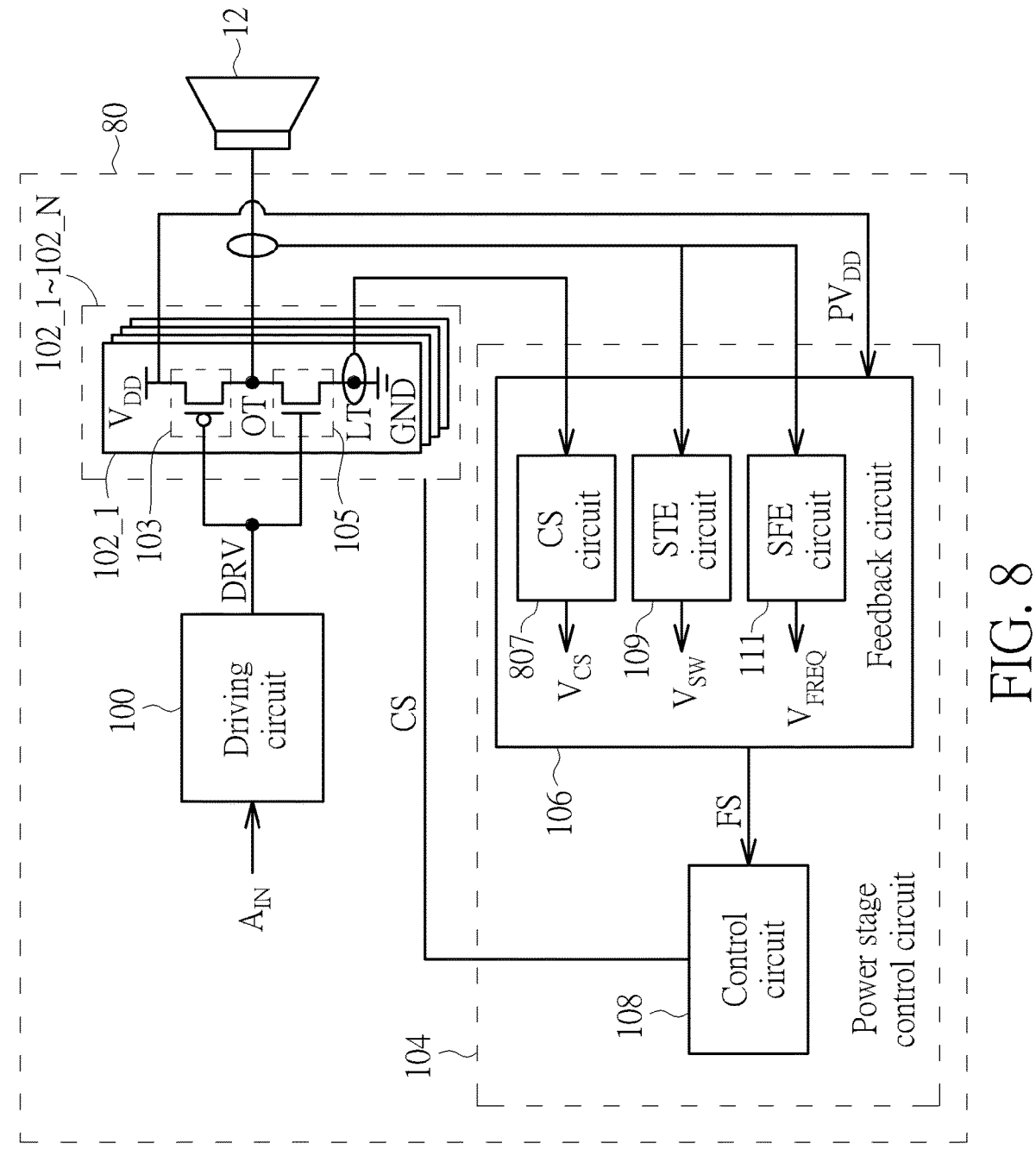
FIG. 8 is a diagram illustrating an audio amplifier according to another embodiment of the present invention.
Figure 9:
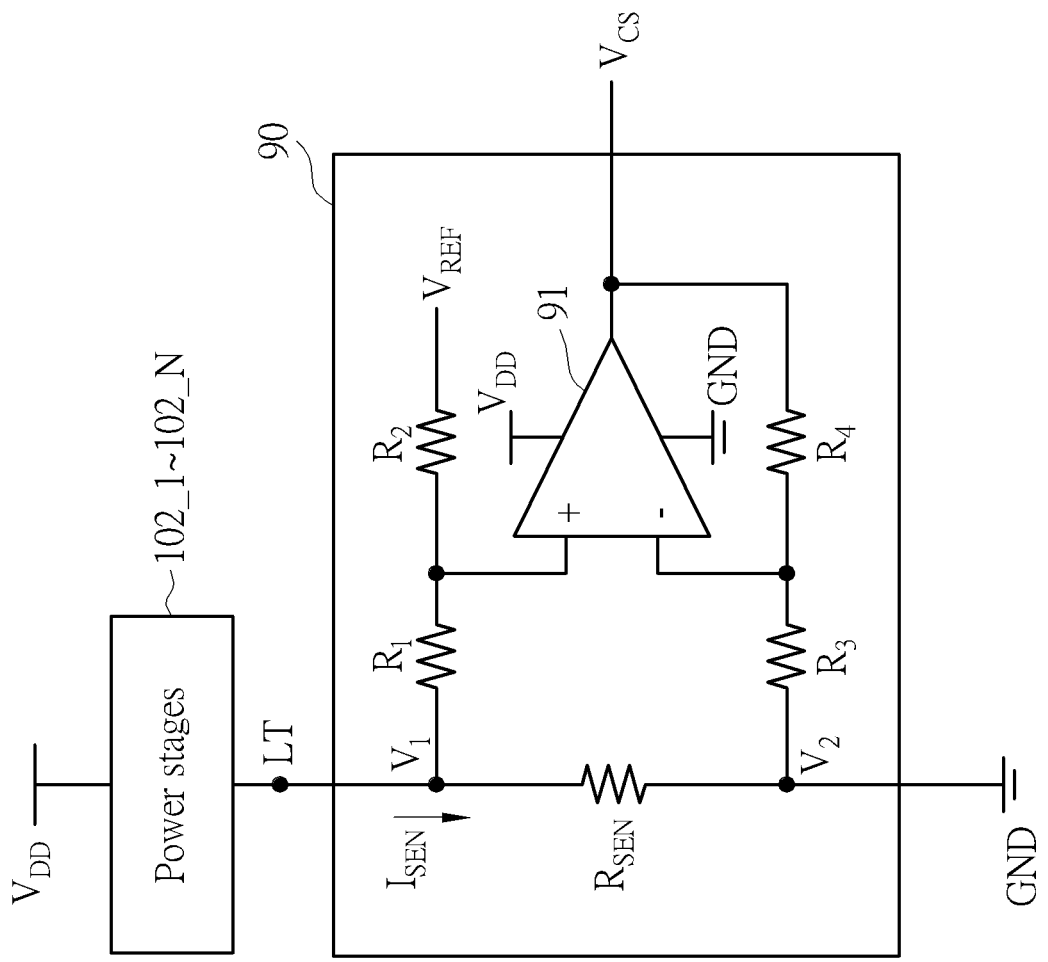
FIG. 9 is a diagram illustrating a current sensing circuit according to another embodiment of the present invention.

FIG. 8 is a diagram illustrating an audio amplifier (e.g. a class-D amplifier 80) according to another embodiment of the present invention. The difference between the class-D amplifier 80 and the class-D amplifier 10 shown in FIG. 1 is that the class-D amplifier 80 may include a current sensing circuit 807 (labeled as "CS circuit" in FIG. 8) that takes the place of the current sensing circuit 107, wherein the current sensing circuit 807 may be coupled to a low side terminal LT at the source terminal of the N-type transistor in each of the power stages 102_1-102_N, and may be arranged to sense and derive an output current at the low side terminal LT, and generate the voltage signal $V_{CS}$ corresponding to the output current as the at least one detection input. In detail, please refer to FIG. 9. FIG. 9 is a diagram illustrating a current sensing circuit 90 according to another embodiment of the present invention, wherein the current sensing circuit 807 shown in FIG. 8 may be implemented by the current sensing circuit 90. As shown in FIG. 9, the current sensing circuit 90 may sense and derive a sensing current $I_{sen}$ from the low side terminal LT of the power stages 102_1-102_N, and generate the voltage signal $V_{CS}$ according to the sensing current $I_{sen}$ and a resistor $R_{SEN}$. The current sensing circuit 90 may include a plurality of resistors $R_1$, $R_2$, $R_3$, $R_4$, and $R_{SEN}$ and an operational amplifier 91, wherein a resistance value of the resistor $R_1$ is equal to that of the resistor $R_3$, a resistance value of the resistor $R_2$ is equal to that of the resistor $R_4$, a resistance value of the resistor $R_{SEN}$ is much smaller than that of the resistors $R_1$ and $R_2$, and a positive power supply and a negative power supply of the operational amplifier 91 are the supply voltage $V_{DD}$ and the ground voltage GND, respectively. Since the operations of the current sensing circuit 90 are similar to that of the current sensing circuit 20 shown in FIG. 2, similar descriptions are not repeated in detail here for brevity.

Figure 10:
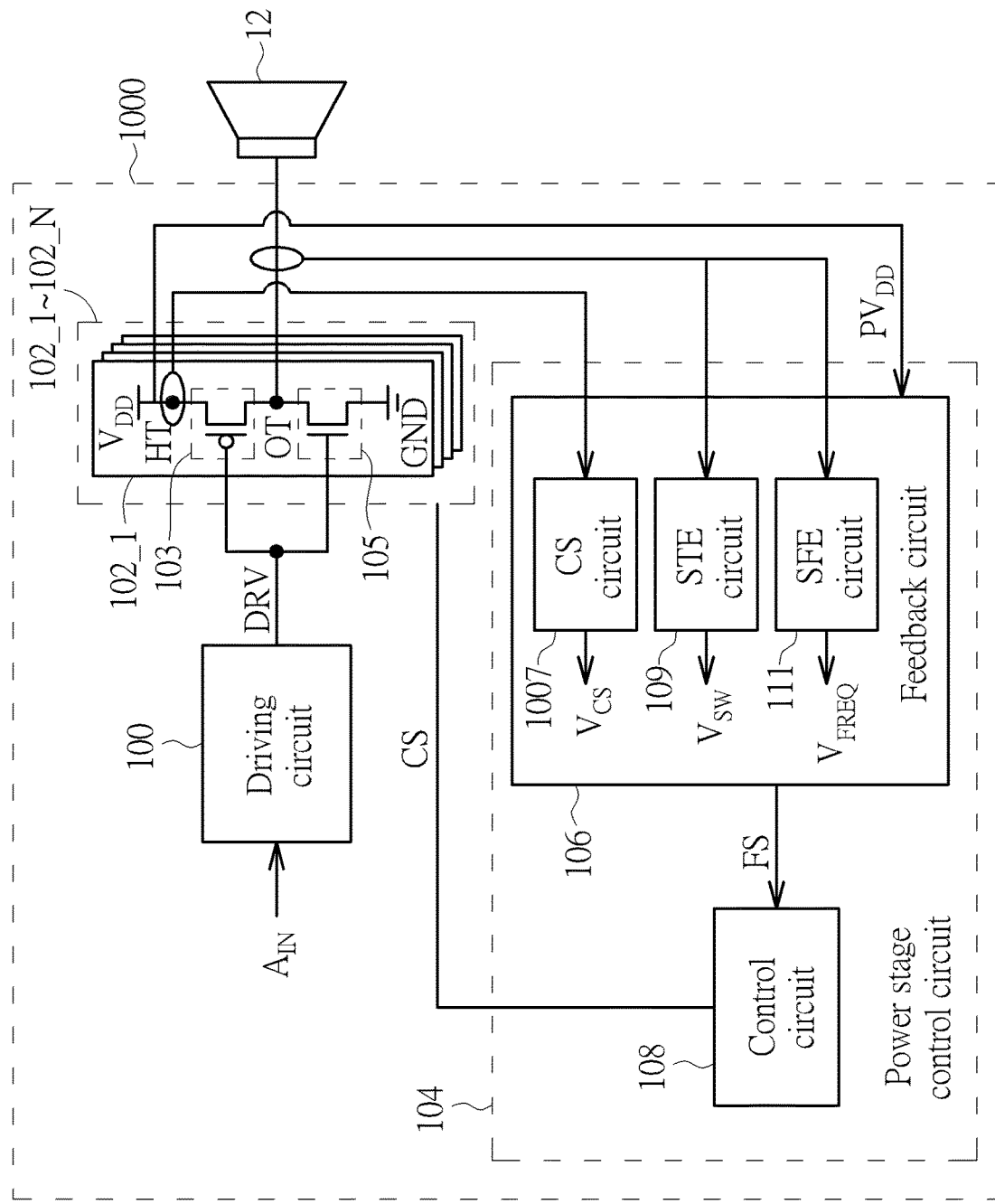
FIG. 10 is a diagram illustrating an audio amplifier according to yet another embodiment of the present invention.
Figure 11:
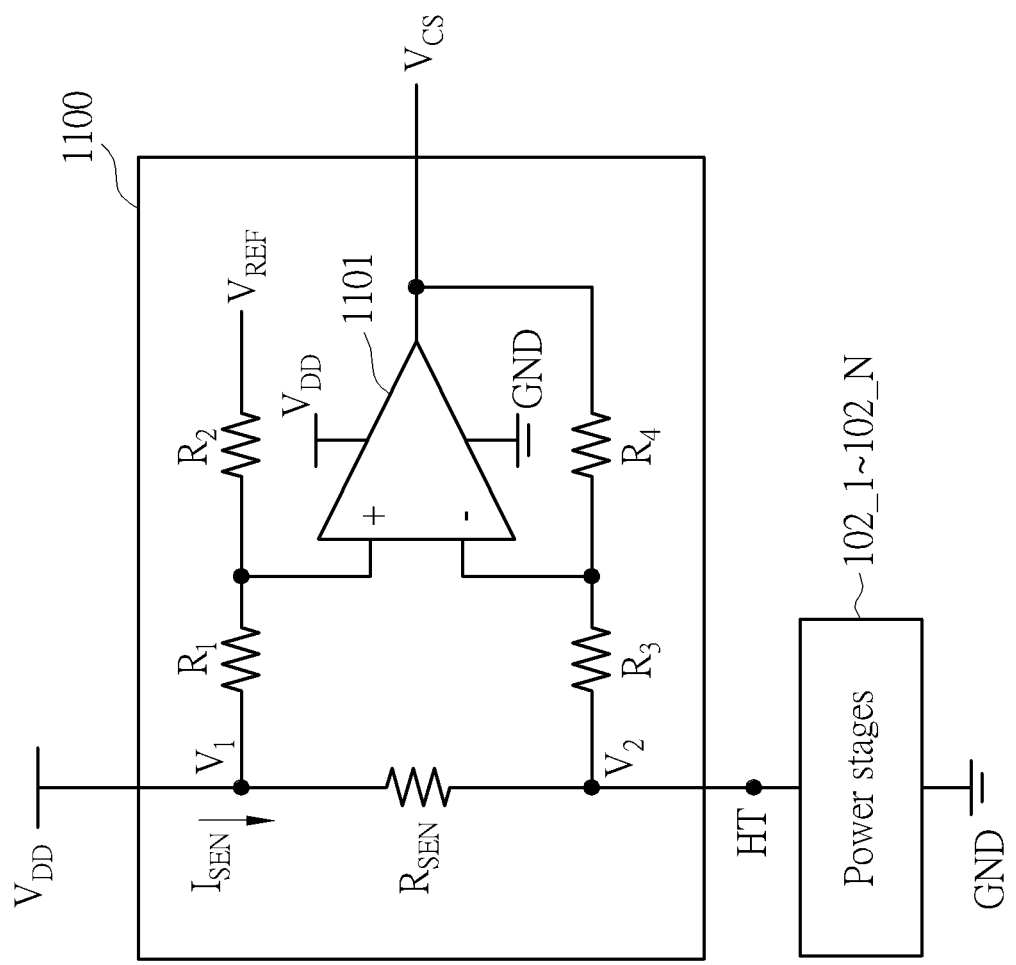
FIG. 11 is a diagram illustrating a current sensing circuit according to yet another embodiment of the present invention.

FIG. 10 is a diagram illustrating an audio amplifier (e.g. a class-D amplifier 1000) according to yet another embodiment of the present invention. The difference between the class-D amplifier 1000 and the class-D amplifier 10 shown in FIG. 1 is that the class-D amplifier 1000 may include a current sensing circuit 1007 (labeled as "CS circuit" in FIG. 10) that takes the place of the current sensing circuit 107, wherein the current sensing circuit 1007 may be coupled to a high side terminal HT at the source terminal of the P-type transistor in each of the power stages 102_1-102_N, and may be arranged to sense and derive an output current at the high side terminal HT, and generate the voltage signal $V_{CS}$ corresponding to the output current as the at least one detection input. In detail, please refer to FIG. 11. FIG. 11 is a diagram illustrating a current sensing circuit 1100 according to yet another embodiment of the present invention, wherein the current sensing circuit 1007 shown in FIG. 10 may be implemented by the current sensing circuit 1100. As shown in FIG. 11, the current sensing circuit 1100 may sense and derive a sensing current $I_{sen}$ from the high side terminal HT of the power stages 102_1-102_N, and generate the voltage signal $V_{CS}$ according to the sensing current $I_{sen}$ and a resistor $R_{SEN}$. The current sensing circuit 1100 may include a plurality of resistors $R_1$, $R_2$, $R_3$, $R_4$, and $R_{SEN}$ and an operational amplifier 1101, wherein a resistance value of the resistor $R_1$ is equal to that of the resistor $R_3$, a resistance value of the resistor $R_2$ is equal to that of the resistor $R_4$, a resistance value of the resistor $R_{SEN}$ is much smaller than that of the resistors $R_1$ and $R_2$, and a positive power supply and a negative power supply of the operational amplifier 1101 are the supply voltage $V_{DD}$ and the ground voltage GND, respectively. Since the operations of the current sensing circuit 1100 are similar to that of the current sensing circuit 20 shown in FIG. 2, similar descriptions are not repeated in detail here for brevity.

In summary, by the class-D amplifier 10/80/1000 of the present invention, under a condition that the supply voltage $V_{DD}$ supplied to the power stages 102_1-102_N varies, the power stage control circuit 104 in the class-D amplifier 10/80/1000 can be able to dynamically track the supply voltage $V_{DD}$ to optimize the power stages 102_1-102_N. In addition, the power stage control circuit 104 can generate the control signal CS under a condition that the power stages 102_1-102_N have the power loss PL with the minimum value, for dynamically controlling the number of turned-on power stages in the power stages 102_1-102_N, which can increase the amplifier efficiency.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An audio amplifier, comprising:
 a plurality of power stages, wherein the plurality of power stages are coupled in parallel with each other, each of the plurality of power stages comprises a first switch and a second switch, the first switch and the second switch are coupled in series between a first reference voltage and a second reference voltage, and the first reference voltage is higher than the second reference voltage;
 a driving circuit, coupled to the plurality of power stages, and arranged to receive an input signal, and generate a driving signal to the plurality of power stages according to the input signal for driving the plurality of power stages;
 a power stage control circuit, comprising:
  a feedback circuit, coupled to the plurality of power stages, and arranged to generate a feedback signal according to at least one detection input, wherein the at least one detection input comprises at least one of a power of the first reference voltage, a voltage signal corresponding to a switching time of the plurality of power stages, and a voltage signal corresponding to a switching frequency of the plurality of power stages; and
  a control circuit, coupled between the feedback circuit and the plurality of power stages, and arranged to generate a control signal according to the feedback signal, wherein the control signal is arranged to dynamically control a number of turned-on power stages in the plurality of power stages.

2. The audio amplifier of claim 1, wherein the first switch and the second switch are a P-type transistor and an N-type transistor, respectively.

3. The audio amplifier of claim 1, wherein both of the first switch and the second switch are N-type transistors.

4. The audio amplifier of claim 1, wherein the power of the first reference voltage is derived from a terminal coupled to the first reference voltage in each of the plurality of power stages.

5. The audio amplifier of claim 1, wherein the voltage signal corresponding to the switching time of the plurality of power stages and the voltage signal corresponding to the switching frequency of the plurality of power stages are derived from an output terminal between the first switch and the second switch in each of the plurality of power stages.

6. The audio amplifier of claim 1, wherein the at least one detection input further comprises a voltage signal corresponding to an output current of the plurality of power stages, and the output current is derived from an output terminal between the first switch and the second switch in each of the plurality of power stages.

7. The audio amplifier of claim 1, wherein the at least one detection input further comprises a voltage signal corresponding to an output current of the plurality of power stages, and the output current is derived from a terminal coupled to the first reference voltage in each of the plurality of power stages.

8. The audio amplifier of claim 1, wherein the at least one detection input further comprises a voltage signal corresponding to an output current of the plurality of power stages, and the output current is derived from a terminal coupled to the second reference voltage in each of the plurality of power stages.

9. The audio amplifier of claim 1, wherein the control circuit is a digital circuit, and comprises:
 at least one analog to digital converter (ADC), arranged to convert the feedback signal into at least one digital signal;
 a calculation circuit, arranged to calculate a power loss of the plurality of power stages according to the at least one digital signal; and
 an optimization circuit, arranged to minimize the power loss to generate a minimum result, and generate the control signal according to the minimum result.

10. The audio amplifier of claim 9, wherein the power loss comprises a conduction loss, a switching loss, and a gate switching loss; and the control circuit further comprises:
 an addition circuit, coupled between the calculation circuit and the optimization circuit, and arranged to combine the conduction loss, the switching loss, and the gate switching loss, to generate an addition result;
 wherein the optimization circuit is arranged to minimize the addition result to generate the minimum result.

11. The audio amplifier of claim 1, wherein the control circuit is an analog circuit, and comprises:
 an adder circuit, arranged to add a voltage corresponding to a current flowing from the first switch and the second switch to an output terminal between the first switch and the second switch in each of the plurality of power stages to a voltage corresponding to the power of the first reference voltage, to generate a first voltage;
 a multiplier circuit, coupled to the adder circuit, and arranged to obtain a first time according to the first voltage and the voltage corresponding to the current flowing from the first switch and the second switch to the output terminal between the first switch and the second switch in each of the plurality of power stages;
 a rooter circuit, coupled to the multiplier circuit, and arranged to obtain a second voltage according to the first time, wherein the second voltage corresponds to a number of turned-on power stages in the plurality of power stages; and
 an analog to digital converter (ADC), coupled to the rooter circuit, and arranged to generate the control signal according to the second voltage.

12. The audio amplifier of claim 1, wherein the audio amplifier is a class-D amplifier.

13. An audio amplifier, comprising:
 a plurality of power stages, wherein the plurality of power stages are coupled in parallel with each other, each of the plurality of power stages comprises a first switch and a second switch, the first switch and the second switch are coupled in series between a first reference voltage and a second reference voltage, and the first reference voltage is higher than the second reference voltage;
 a driving circuit, coupled to the plurality of power stages, and arranged to receive an input signal, and generate a driving signal to the plurality of power stages according to the input signal for driving the plurality of power stages;
 a power stage control circuit, comprising:
  a feedback circuit, coupled to the plurality of power stages, and arranged to generate a feedback signal according to at least one detection input, wherein the at least one detection input comprises a voltage signal corresponding to an output current of the plurality of power stages, and the output current is derived from a terminal coupled to the first reference voltage or a terminal coupled to the second reference voltage in each of the plurality of power stages; and a control circuit, coupled between the feedback circuit and the plurality of power stages, and arranged to generate a control signal according to the feedback signal, wherein the control signal is arranged to dynamically control a number of turned-on power stages in the plurality of power stages.

14. The audio amplifier of claim 13, wherein the first switch and the second switch are a P-type transistor and an N-type transistor, respectively.

15. The audio amplifier of claim 13, wherein both of the first switch and the second switch are N-type transistors.

16. The audio amplifier of claim 13, wherein the control circuit is a digital circuit, and comprises:

at least one analog to digital converter (ADC), arranged to convert the feedback signal into at least one digital signal;

a calculation circuit, arranged to calculate a power loss of the plurality of power stages according to the at least one digital signal; and an optimization circuit, arranged to minimize the power loss to generate a minimum result, and generate the control signal according to the minimum result.

17. The audio amplifier of claim 16, wherein the power loss comprises a conduction loss, a switching loss, and a gate switching loss; and the control circuit further comprises:

an addition circuit, coupled between the calculation circuit and the optimization circuit, and arranged to combine the conduction loss, the switching loss, and the gate switching loss, to generate an addition result;

wherein the optimization circuit is arranged to minimize the addition result to generate the minimum result.

18. The audio amplifier of claim 13, wherein the control circuit is an analog circuit, and comprises:

an adder circuit, arranged to add a voltage corresponding to a current flowing from the first switch and the second switch to an output terminal between the first switch and the second switch in each of the plurality of power stages to a voltage corresponding to the power of the first reference voltage, to generate a first voltage;

a multiplier circuit, coupled to the adder circuit, and arranged to obtain a first time according to the first voltage and the voltage corresponding to the current flowing from the first switch and the second switch to the output terminal between the first switch and the second switch in each of the plurality of power stages;

a rooter circuit, coupled to the multiplier circuit, and arranged to obtain a second voltage according to the first time, wherein the second voltage corresponds to a number of turned-on power stages in the plurality of power stages; and an analog to digital converter (ADC), coupled to the rooter circuit, and arranged to generate the control signal according to the second voltage.

19. The audio amplifier of claim 13, wherein the audio amplifier is a class-D amplifier.

\* \* \* \* \*